US010935654B1

(12) United States Patent
Shah et al.

(10) Patent No.: US 10,935,654 B1
(45) Date of Patent: Mar. 2, 2021

(54) DIGITAL SIGNAL SHAPING USING I/Q MODULATOR

(71) Applicant: BAE Systems Information and Electronic Systems Integration Inc., Nashua, NH (US)

(72) Inventors: Haritkumar M. Shah, Selden, NY (US); Robert C. Bonino, Northport, NY (US); Martin T. Horstman, Jr., Mastic Beach, NY (US); Peter Ladubec, Jr., Centereach, NY (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 246 days.

(21) Appl. No.: 16/150,435

(22) Filed: Oct. 3, 2018

(51) Int. Cl.
*G01S 13/78* (2006.01)
*H04L 27/20* (2006.01)
*H04L 27/36* (2006.01)
*H04B 1/04* (2006.01)
*H04L 27/26* (2006.01)

(52) U.S. Cl.
CPC .......... *G01S 13/78* (2013.01); *H04L 27/2053* (2013.01); *H04L 27/364* (2013.01); *H03F 2200/336* (2013.01); *H04B 1/04* (2013.01); *H04L 27/20* (2013.01); *H04L 27/2627* (2013.01); *H04L 27/2649* (2013.01)

(58) Field of Classification Search
CPC ... B64C 39/024; F41H 11/02; F41H 13/0006; F41H 11/00; F41H 13/0043; F41H 11/04; F41F 3/042; F41F 1/00; H04K 3/42; H04K 3/825; H04K 3/92; H04K 3/90; H04K 3/00; H04K 3/82; G01S 17/66; G01S 7/495; G01S 5/0226; G01S 1/042; H04B 7/0452; H04B 7/0669; H04B 1/04; H04B 1/40; H03F 2200/336; H04L 1/0041; H04L 1/0625; H04L 27/20; H04L 27/2649; H04L 27/2627
See application file for complete search history.

(56) References Cited

U.S. PATENT DOCUMENTS 7,706,475 B1 * 4/2010 Kopikare ................ H04L 27/38
375/324
9,094,114 B1 * 7/2015 Hou ........................ H04B 15/00
9,791,551 B1 * 10/2017 Eshraghi ................. G01S 7/038
(Continued)

*Primary Examiner* — Olumide Ajibade Akonai
(74) *Attorney, Agent, or Firm* — Finch & Maloney PLLC; Scott J. Asmus

(57) ABSTRACT

A transmitter includes a processing circuit to generate I level data and Q level data that, when respectively converted to I baseband input and Q baseband input, cause a carrier signal modulated by the I baseband input and the Q baseband input to have a desired edge shape in the time domain. The edge shape includes a low portion, a high portion, and an edge portion between the low portion and the high portion. The edge portion has a desired edge time compatible with the frequency of the carrier signal. The transmitter further includes a digital-to-analog converter (DAC) to convert the I level data to the I baseband input and the Q level data to the Q baseband input, and an in-phase and quadrature (I/Q) modulator to perform I/Q modulation of the carrier signal according to the I baseband input and the Q baseband input.

15 Claims, 6 Drawing Sheets

(56) References Cited

U.S. PATENT DOCUMENTS

| | | | | |
|---|---|---|---|---|
| 2008/0007346 A1* | 1/2008 | Jensen | ............... | H03C 3/0925 |
| | | | | 331/16 |
| 2008/0116987 A1* | 5/2008 | Ryan | ............... | H03C 1/60 |
| | | | | 332/170 |
| 2010/0309039 A1* | 12/2010 | Rivers | ............... | G01S 13/781 |
| | | | | 342/42 |
| 2012/0092205 A1* | 4/2012 | Bourdelais | ............... | G01S 7/282 |
| | | | | 342/21 |
| 2015/0333781 A1* | 11/2015 | Alon | ............... | H03F 3/19 |
| | | | | 370/277 |

* cited by examiner

FIG. 4A

| Time (ns) | Level | Percent | |
|---|---|---|---|
| 0 | 0 | 0.00 | Curve In Portion (e.g., Exponential) |
| 12.5 | 26 | 0.08 | |
| 25 | 51 | 0.16 | |
| 37.5 | 102 | 0.31 | |
| 50 | 205 | 0.63 | |
| 62.5 | 410 | 1.25 | |
| 75 | 819 | 2.50 | |
| 87.5 | 1638 | 5.00 | |
| 100 | 3277 | 10.00 | Rising Edge Portion (e.g., Linear) |
| 112.5 | 6553 | 20.00 | |
| 125 | 9830 | 30.00 | |
| 137.5 | 13107 | 40.00 | |
| 150 | 16384 | 50.00 | |
| 162.5 | 19660 | 60.00 | |
| 175 | 22937 | 70.00 | |
| 187.5 | 26214 | 80.00 | |
| 200 | 29490 | 90.00 | |
| 212.5 | 31129 | 95.00 | Curve Out Portion (e.g., Exponential Decay) |
| 225 | 31948 | 97.50 | |
| 237.5 | 32357 | 98.75 | |
| 250 | 32562 | 99.38 | |
| 262.5 | 32665 | 99.69 | |
| 275 | 32716 | 99.84 | |
| 287.5 | 32741 | 99.92 | |
| 300 | 32767 | 100.00 | |

FIG. 5

Method of Digital Signal Shaping 500

( Start )

↓

Receive interrogating requests from identification friend or foe (IFF) interrogator
510
} FPGA or Microprocessor 310

↓

Generate I level data and Q level data as IFF responses in response to the interrogating requests; I level data and Q level data, when respectively converted to I baseband input and Q baseband input, cause carrier signal modulated by I baseband input and Q baseband input to have desired edge shape in time domain; edge shape includes low portion, high portion, and edge portion between low portion and high portion; edge portion has desired edge time compatible with frequency of carrier signal
520
} FPGA or Microprocessor 310

↓

Convert generated I level data to I baseband input and generated Q level data to Q baseband input
530
} DAC 320

↓

Synchronize generating I level data and Q level data with converting I level data to I baseband input and Q level data to Q baseband input
540
} Clock Circuit 330

↓

Perform I/Q modulation of carrier signal according to I baseband input and Q baseband input
550
} I/Q Modulator 340

↓

( End )

DIGITAL SIGNAL SHAPING USING I/Q MODULATOR

FIELD OF THE DISCLOSURE

This disclosure relates to digital signal shaping using an I/Q modulator, such as shaping edges, pulses, or other shapes for use in an identification friend or foe (IFF) transponder.

BACKGROUND

In communication applications such as an IFF transponder, signal shaping (e.g., edges and pulses) is an important component for making the communication device perform as intended. However, there are a number of non-trivial issues associated with signal shaping for communication devices.

BRIEF DESCRIPTION OF THE DRAWINGS

FIGS. 4A and 4B are a table and corresponding graph of example digital voltage levels for digital signal shaping over a sampling period using an I/Q modulator, such as by the transmitter of FIG. 3, according to an embodiment of the present disclosure.

FIG. 5 is a flow diagram of an example method of digital signal shaping using an I/Q modulator, according to an embodiment of the present disclosure.

Figure 1:
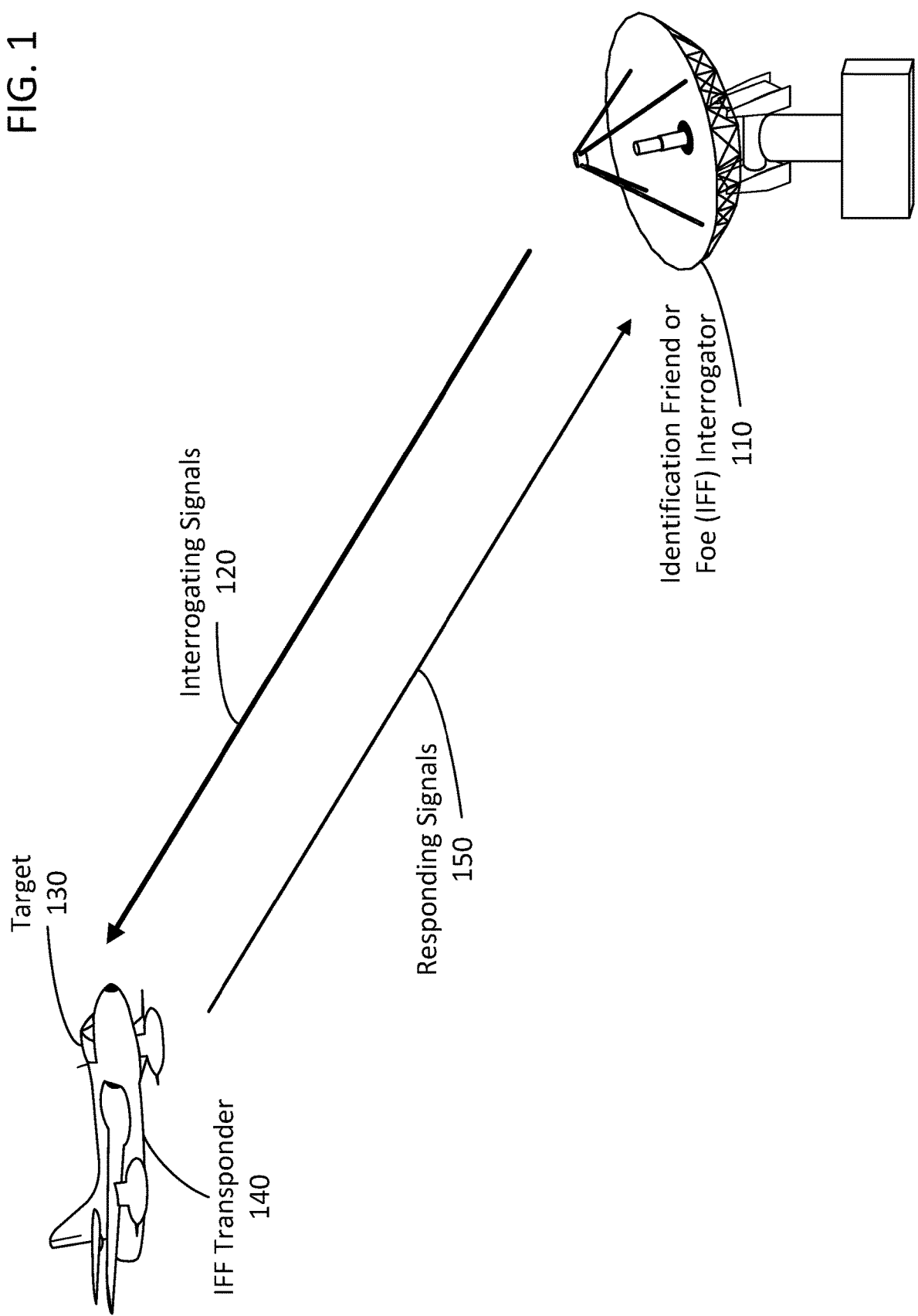
FIG. 1 is a schematic diagram of an environment in which an example identification friend or foe (IFF) transponder is employed, according to an embodiment of the present disclosure.

Although the following Detailed Description will proceed with reference being made to illustrative embodiments, many alternatives, modifications, and variations thereof will be apparent to those in light of the present disclosure.

DETAILED DESCRIPTION

In an embodiment of the present disclosure, a transmitter for performing digital signal shaping using an I/Q modulator is provided. The transmitter includes the I/Q modulator, a digital-to-analog converter (DAC), a processing circuit such as a field-programmable gate array (FPGA) or a microprocessor, and a clock circuit. The I/Q modulator performs I/Q modulation of a carrier signal according to (analog) I baseband input and Q baseband input. The DAC converts (digital) I level data to the I baseband input and Q level data to the Q baseband input. The processing circuit performs digital signal shaping by generating the I level data and the Q level data that, when respectively converted to the I baseband input and the Q baseband input, cause the modulated carrier signal to have a desired digital signal shape (such as a rising edge connecting a low value to a high value) in the time domain. In an embodiment, the clock circuit synchronizes generating the I level data and the Q level data in the processing circuit with converting the I level data to the I baseband input and the Q level data to the Q baseband input in the DAC.

In an embodiment, an identification friend or foe (IFF) transponder includes the transmitter. In an embodiment, the transmitter generates the modulated carrier signal as IFF response signals in response to IFF interrogation signals received by the transponder. In an embodiment, the digital signal shape includes a transition having a low portion, a high portion, and an edge portion between the low portion and the high portion. The edge portion has a desired edge time. In an embodiment, the digital signal shape includes a pulse having a first portion, a second portion, a third portion, a fourth portion, and a fifth portion in time order. The first portion and the fifth portion are low portions and the third portion is a high portion (in another embodiment, the first portion and the fifth portion are high portions and the third portion is a low portion). The second portion and the fourth portion include a rising edge portion and a falling edge portion. The rising edge portion has a desired rise time, the falling edge portion has a desired fall time, and the third portion has a desired high time (or, in another embodiment, if the third portion is the low portion, then the third portion or has a desired low time).

General Overview

As mentioned above, there are a number of non-trivial issues associated with signal shaping for communication devices, such as IFF transponders. For example, IFF transponders can transmit information in different formats, such as I/Q modulated data (e.g., minimum-shift keying or MSK) and pulse (or other shape) based information. In addition, edge shaping can be used with some or all of these formats (such as to send bursts or pulses of I/Q modulated data). The multiple formats, however, can complicate the transmitter circuitry with separate components to produce, for example, the I/Q modulated data, the pulse information, and the edge shaping, while meeting other requirements such as keeping modulated carrier signals within an appropriate frequency bandwidth.

Accordingly, in an embodiment of the present disclosure, a digital signal shaping technique using an I/Q modulator is provided, such as to reduce the complexity and circuitry of an IFF transponder. Here, the I/Q modulator performs the edge shaping (as controlled digitally by a processing circuit) as well as the I/Q modulation (e.g., MSK) for I/Q modulation techniques. This can save complexity and circuitry versus having separate edge-shaping circuitry (such as separate analog edge-shaping circuitry). In an embodiment, the I/Q modulator generates pulses whose edges have controlled rise and fall times, which can be useful for setting gate voltages of transistors (e.g., to turn them on or off, or set them at a particular level), such as laterally-diffused metal-oxide semiconductor (LDMOS) transistors to amplify the generated pulses for transmitting by an antenna. The generated pulses are sufficient to meet requirements (such as rise and fall times of a digital waveform, staying confined in a particular wavelength spectrum, and the like) of receiving circuitry driven by such pulses.

In one such embodiment, a field-programmable gate array (FPGA) or microprocessor for an IFF transponder is designed to input received, demodulated, and digitized interrogating signals from an IFF interrogator, and generate and transmit appropriate responding signals. Some or all of the responding signals are generated with desired shapes (such as rise time, fall time, and high time). Corresponding I level data (e.g., voltage or current levels, such as digital values of such levels) and Q level data are generated by the FPGA or microprocessor. The generated I level data and Q level data are input to a digital-to-analog converter (DAC). The DAC converts the I level data to corresponding I baseband input (e.g., analog voltages or currents) and converts the Q level data to corresponding Q baseband input. In some embodiments, the I baseband input and the Q baseband input are differential signals (e.g., differential voltages centered about a common mode voltage).

The I baseband input and the Q baseband input drive the I/Q modulator to modulate a carrier signal using I/Q modulation. By generating appropriate values for the I level data and the Q level data, the FPGA or microprocessor can cause the modulated carrier signal to resemble the desired shape (e.g., pulse with appropriate rise and fall times) with sufficient fidelity do drive corresponding amplifying and receiving circuitry (such as transistors) appropriately. For example, in an embodiment, the FPGA or microprocessor supplies I level data and Q level data to the DAC. The DAC in turn converts the corresponding I and Q level data to I and Q baseband input.

When generating signal shapes (such as rising and falling edges), for example, the I and Q baseband input is used by the I/Q modulator to generate a shaped pulse in the time domain with a controlled rise and fall time. Performing both the shaping (e.g., pulse shaping, where features such as width and spacing of pulses conveys the information, or I/Q modulated pulses, where rising and falling edges delineate pulses of numerous bits encoded with I/Q modulation) and the I/Q modulation (e.g., MSK I/Q modulation, where bits or other quantities of data are encoded on the I and Q bands of a carrier signal) with the same I/Q modulator provides a reduction in surface area and power while improving functionality.

In an embodiment, the processing circuit (e.g., microprocessor or FPGA) generates the I level data and the Q level data for a desired rising edge so that the edge portion starts at a first time (e.g., at a low portion) and ends at a second time (e.g., at a high portion), with the difference between the first time and the second time being the desired edge time. Here, the I level data and the Q level data can take on discrete values, such as between 0 and 1000. The I level data corresponding to the first time is a first I level data value (e.g., a low value, such as 10% of the range, or 100 in this case) and the I level data corresponding to the second time is a second I level data value (e.g., a high value, such as 90% of the range, or 900 in this case), with similar or comparable data values for the Q level data. In an embodiment, the I level data corresponding to times between the first time and the second time are linear interpolations between the first I level data value and the second I level data value (e.g., 200, 300, 400, 500, 600, 700, and 800 for seven intermediate times in the above example), and likewise or similarly for the Q level data.

In an embodiment, a computer program product including one or more non-transitory machine-readable storage mediums having instructions encoded thereon for performing the digital signal shaping by one or more of the above techniques is provided, using the processing circuit in combination with the DAC and the I/Q modulator. In an embodiment, a system for digital signal shaping is provided, the system including the computer program product, the processing circuit to execute the encoded instructions, the DAC, and the I/Q modulator.

In an embodiment, an FPGA design product including one or more non-transitory machine-readable storage mediums having FPGA design components encoded thereon is provided. When an FPGA is reconfigured by the design product, the FPGA performs one or more of the above techniques for digital signal shaping using an I/Q modulator. The process includes receiving one or more digital interrogating requests, generating I level data and Q level data in response to the received interrogating requests; and sending the generated I level data and the generated Q level data to a DAC to be respectively converted to I baseband input and Q baseband input, which are input to the I/Q modulator to perform I/Q modulation of a carrier signal according to the I baseband input and the Q baseband input. The modulated carrier signal has a desired edge shape in the time domain. The edge shape includes a low portion, a high portion, and an edge portion between the low portion and the high portion. The edge portion has a desired edge time compatible with the frequency of the carrier signal.

In an embodiment, an IFF transponder includes an FPGA as configured by the FPGA design product. In an embodiment, a system for digital signal shaping is provided. The system includes the FPGA design product, the FPGA to be configured by the FPGA design components, the DAC, and the I/Q modulator. The transponder can be located on moving platforms, such as aircraft (e.g., airplanes and helicopters), watercraft, land vehicles, spacecraft, to name a few. Numerous other example embodiments and configurations will be apparent in light of this disclosure.

System Architecture

FIG. 1 is a schematic diagram of an environment in which an example identification friend or foe (IFF) transponder 140 is employed, according to an embodiment of the present disclosure. There is an IFF interrogator 110 that wants to determine if the target 130 is a friendly or potentially hostile aircraft. The IFF interrogator 110 sends an encoded set of interrogating signals 120 (requests) to the target 130, which is equipped with a corresponding IFF transponder 140 (such as those described in the present disclosure). The IFF transponder 140 receives the interrogating signals 120 and responds with an encoded set of responding signals 150 (responses).

The interrogating signals 120 can contain numerous electronic challenges, for which the IFF transponder 140 has to respond appropriately via the responding signals 150. If the IFF transponder 140 responds appropriately, the IFF interrogator 110 can determine that the target 130 is a friendly aircraft (along with other identifying information). The responding signals 150 can be encoded, and be modulated in multiple ways, such as I/Q modulation (e.g., MSK I/Q modulation, such as in pulses each having numerous bits encoded using MSK I/Q modulation) and digital signal modulation (e.g., pulses including rising and falling edges having corresponding rise and fall times). For both the I/Q modulation and the digital signal modulation, the pulses include rising and falling edges having corresponding rise and fall times compatible with the carrier frequency (e.g., to stay within an appropriate frequency range).

Figure 2:
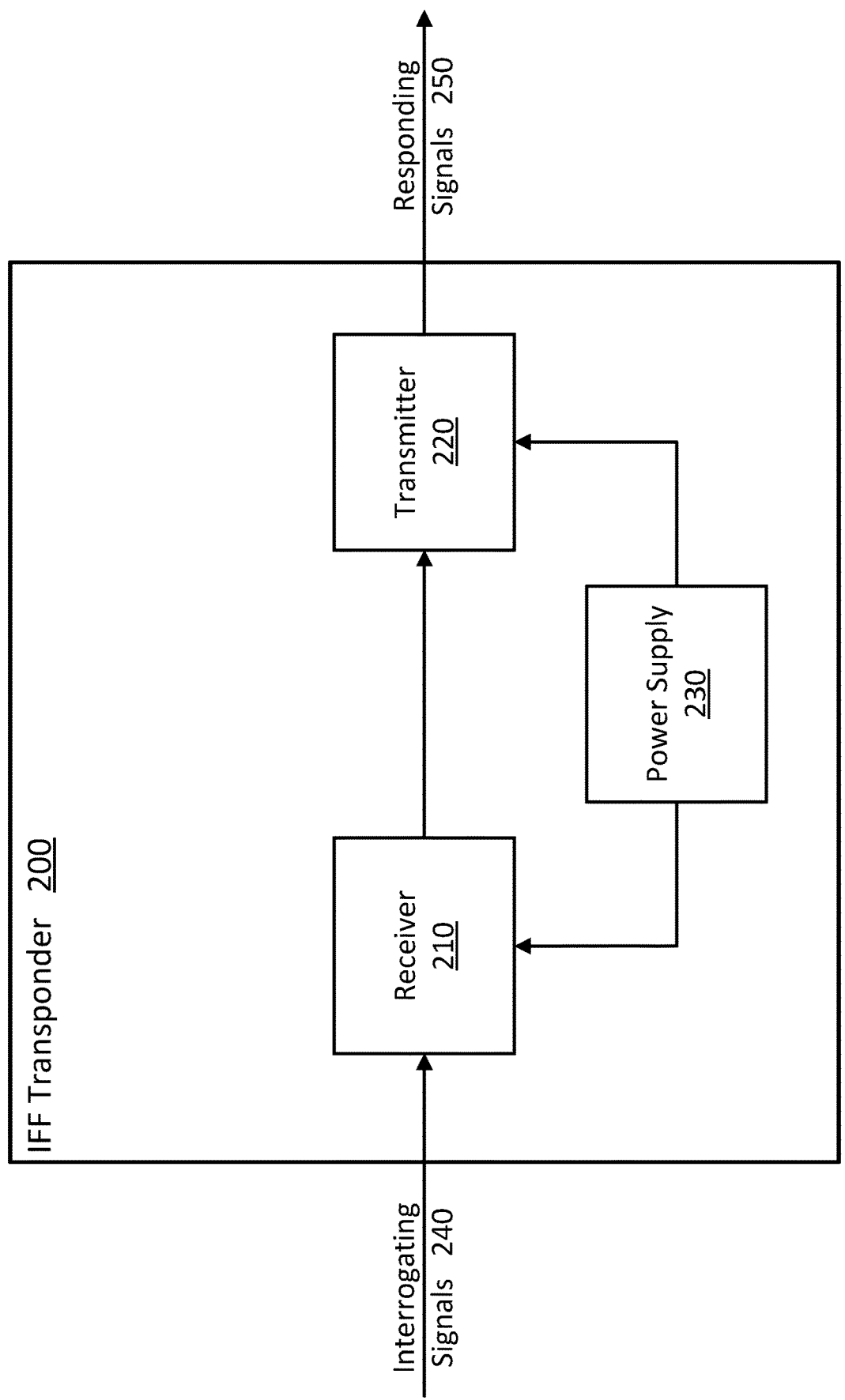
FIG. 2 is a block diagram of an example IFF transponder, such as the IFF transponder of FIG. 1, according to an embodiment of the present disclosure.

FIG. 2 is a block diagram of an example IFF transponder 200, such as the IFF transponder 140 of FIG. 1, according to an embodiment of the present disclosure. Components of the IFF transponder 200 and other electronic components, circuits, and techniques described herein can be implemented as (or on) an electronic processing component, such as a signal processor, a field programmable gate array (FPGA), a microprocessor, or the like. For example, parts of the IFF transponder 200 and other components or methods can be implemented in hardware or software, or some combination of the two. For instance, components of the IFF transponder 200 can be implemented as a microprocessor with instructions encoded therein that, when executed by the microprocessor, cause the microprocessor to carry out some of the tasks of the IFF transponder 200. In another embodiment, parts of the IFF transponder 200 may be implemented as a custom circuit such as a field programmable gate array (FPGA) configured to carry out these tasks. In a further example, there are one or more memory units (such as non-volatile memory units) that is or are coupled to the processing component.

For example, components of the IFF transponder 200 and other circuits disclosed herein may be custom hardware circuits or general-purpose computer hardware configured (e.g., through software, firmware, customized logic, to name a few) to carry out the tasks assigned to the circuit. While circuits are illustrated as being made up of other circuits by function, in other embodiments, two or more circuits may be combined into a single circuit performing the functionality of the two or more circuits. In still other embodiments, a single circuit can be divided into two or more circuits, each performing separate functions performed by the single circuit.

As will be further appreciated, a circuit as used herein is a physical structure capable of carrying out one or more functionalities as variously provided herein, whether the structure be hardware only such as purpose-built semiconductor (e.g., gate-level logic or application specific integrated circuit) or a printed circuit board populated with discrete components configured and arranged to carry out the various functionalities provided herein, or a processor-based system programmed with computer code or instructions that are executable by the processor-based system to carry out the various functionalities provided herein, or a combination of such hardware and software based architectures (e.g., printed circuit board with one or more embedded routines executable by one or more processors). Numerous such embodiments and configurations will be appreciated in light of this disclosure.

Returning to FIG. 2, the IFF transponder 200 includes three components, namely a receiver 210, a transmitter 220, and a power supply 230. The IFF transponder 200 (and more specifically, the receiver 210) receives interrogating signals 240 (e.g., analog signals emitted from an IFF interrogator, such as the IFF interrogator 110 of FIG. 1) and replies with responding signals 250 (e.g., analog signals emitted by the transmitter 220). In further detail, the receiver 210 receives the interrogating signals 240, and demodulates, digitizes, and decrypts the signals to produce, for example, digital electronic challenges. These digital challenges are sent to the transmitter 220, which responds, for example, by shaping, modulating, and emitting the responding signals 250. The power supply 230 supplies power to the receiver 210 and the transmitter 220.

Figure 3:
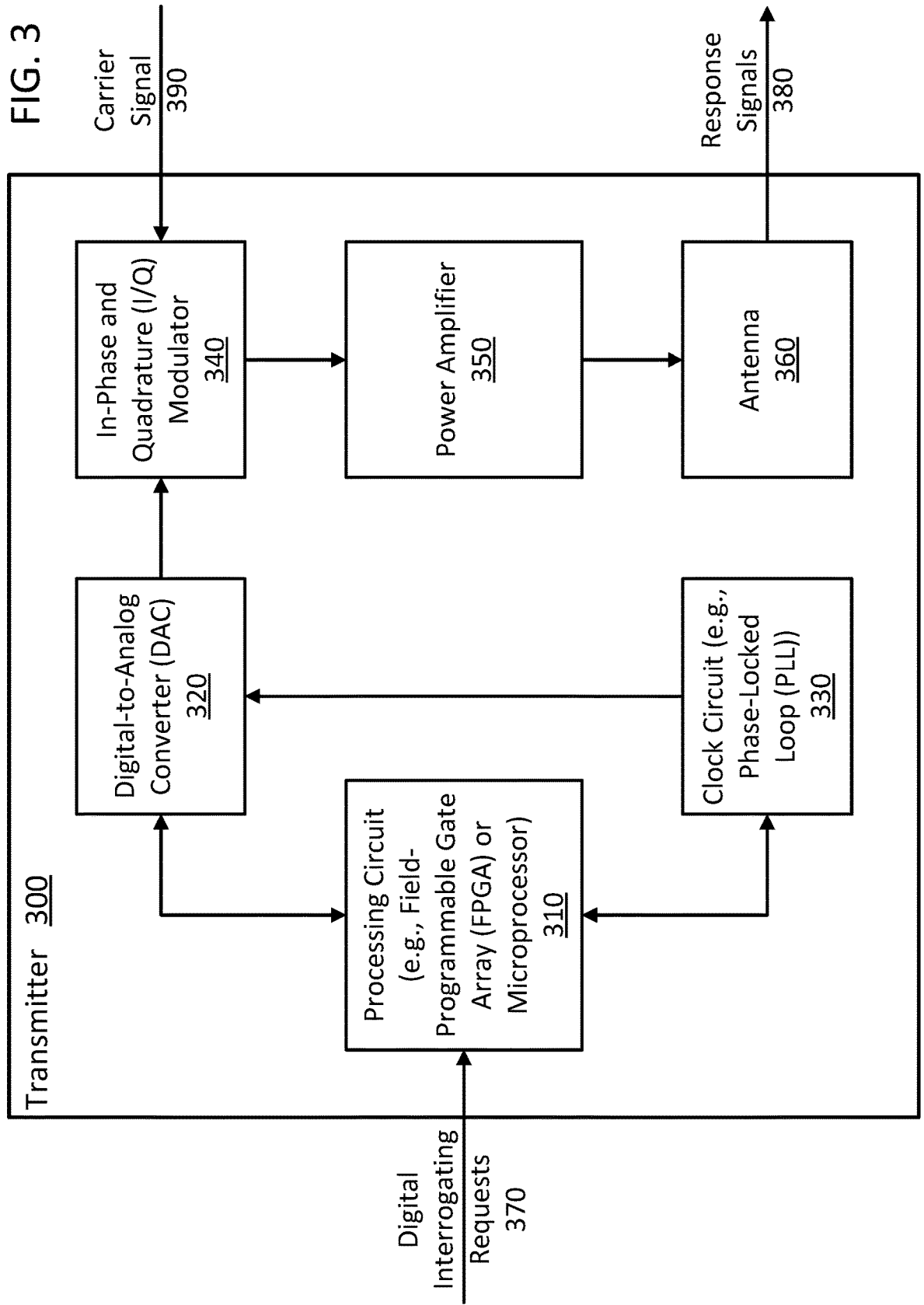
FIG. 3 is a block diagram of an example transmitter of an IFF transponder, such as a transmitter for the IFF transponder of FIG. 2, according to an embodiment of the present disclosure.

FIG. 3 is a block diagram of an example transmitter 300 of an IFF transponder, such as the transmitter 220 of the IFF transponder 200 of FIG. 2, according to an embodiment of the present disclosure. The transmitter 300 includes a processing circuit 310, a digital-to-analog converter (DAC) 320, a clock circuit 330, an I/Q modulator 340, a power amplifier 350, and an antenna 360. Among other roles, the transmitter 300 inputs digital interrogating requests 370 and a carrier signal 390, and modulates the carrier signal 390 using the I/Q modulator 340 (as described further below) to generate and emit response signals 380.

In further detail, in some embodiments, the processing circuit 310 is a field-programmable gate array (FPGA) or microprocessor configured to generate digital signal shapes (e.g., pulse shape, rise time, fall time, high time low time, and the like) as responses or portions of responses to the interrogating requests 370. The generating of the digital signal shapes includes generating corresponding level data, such as digital current or voltage levels. For example, the FPGA can be supplied with design data to customize its logic or the microprocessor can be supplied with instructions to execute and carry out these tasks. Separate level data is generated for the I (in-phase) component and the Q (quadrature) component of each digital signal shape. The I level data and the Q level data are input to the DAC 320, which converts each stream into a corresponding analog stream (e.g., I baseband data and Q baseband data, respectively).

In some embodiments, the generating of the I level data and the Q level data is synchronized with the converting of the I level data and the Q level data to I baseband data and Q baseband data, respectively, using the clock circuit 330. In some such embodiments, the clock circuit 330 is a phase-locked loop (PLL) that drives the FPGA (or microprocessor) 310 and the DAC 320 to process a round of I level data and Q level data as well as I baseband data and Q baseband data (such as one clock cycle apart, as in pipelined fashion). It should be noted that while one DAC 320 is illustrated and discussed for ease of description, in some embodiments, separate DACs are provided for generating the I baseband data and the Q baseband data from the I level data and the Q level data, respectively.

The I baseband data and the Q baseband data (both of which are analog signals, such as voltages or currents) are input into the I/Q modulator 340, together with a carrier signal 390. The I/Q modulator 340 performs I/Q modulation of the carrier signal 390 according to the I baseband data and the Q baseband data. The I/Q modulated carrier signal is then input to the power amplifier 350 to increase the signal strength to a level suitable for transmitting. The amplified modulated carrier signal is input to the antenna 360, which transmits the modulated carrier signal (e.g., as a microwave or radio transmission).

In one or more embodiments, sometimes the I baseband data and the Q baseband data input to the I/Q modulator is for applying known I/Q modulation techniques to the carrier signal 390, such as MSK I/Q modulation (e.g., with analog sine waves as the I baseband data and the Q baseband data), while at other times the I baseband data and the Q baseband data is for generating digital signal shapes (e.g., pulses, low portions, high portions, rising edges, falling edges, and the like) using the I/Q modulator 340. Sometimes the I/Q modulation and digital signal shaping are combined, such as pulses (or bursts) of I/Q modulated data, each pulse or burst including numerous bits encoded with I/Q modulation together with a rising edge shape before the burst and a falling edge shape after the burst. In some such embodiments, the processing circuit (e.g., FPGA, microprocessor, or the like) 310 generates I level data and Q level data (e.g., voltage levels or current levels, the levels being digital levels or numeric quantities) that when converted to analog signals by the DAC 320 and input to the I/Q modulator 340, cause the corresponding modulated carrier signal to take on digital signal shapes (such as pulses) in its waveforms, with or without I/Q modulated data, as appropriate for the response signals 380 to the interrogating signals 370.

Figure 4B:
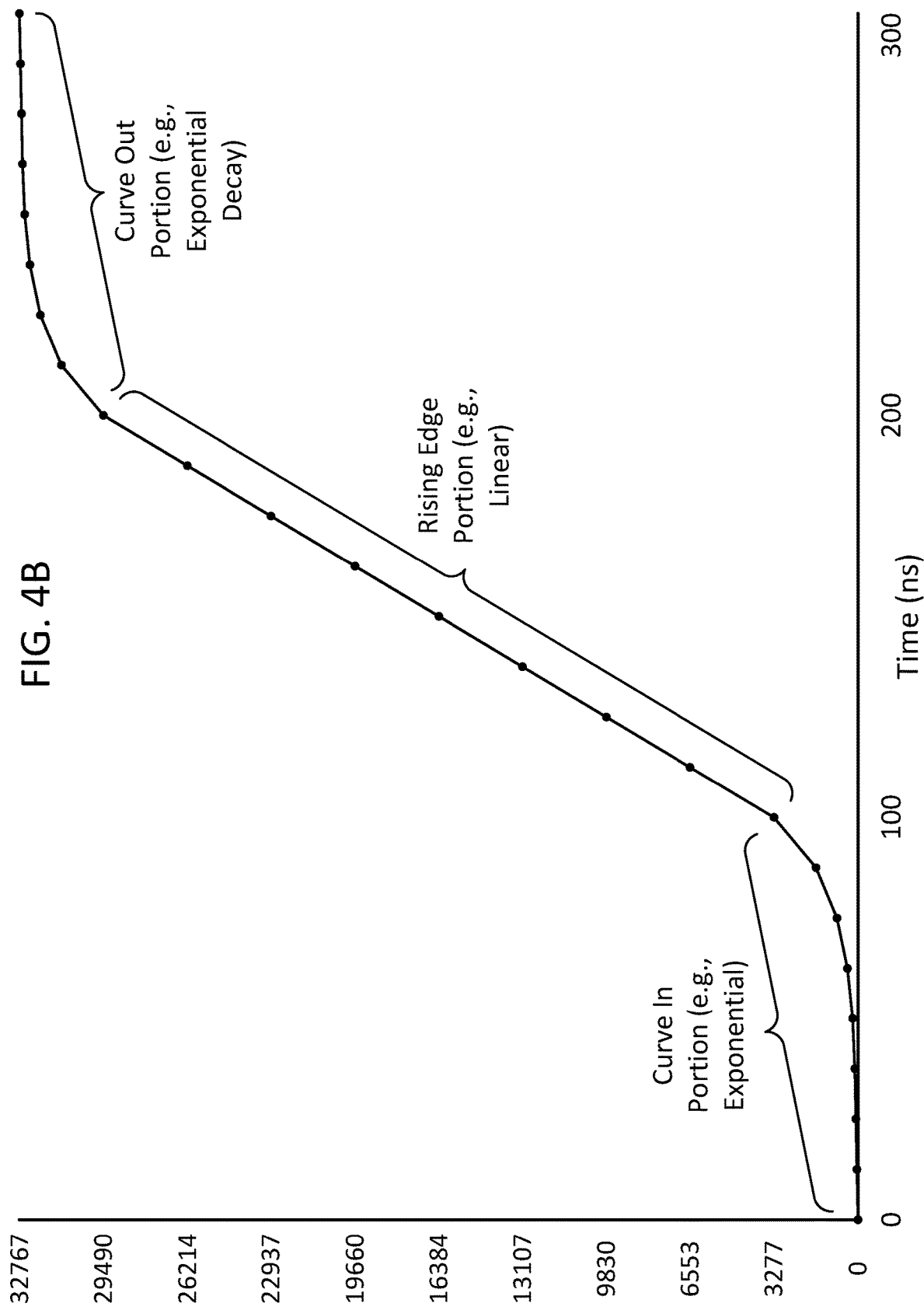

FIGS. 4A and 4B are a table and corresponding graph of example digital voltage levels for digital signal shaping (in this case, a rising edge) over a sampling period using an I/Q modulator, such as by the transmitter 300 of FIG. 3, according to an embodiment of the present disclosure. The voltage levels are being generated, for example, as the I level data, the Q level data, or both. In some embodiments, the Q level data is the inverse of the I level data (e.g., corresponding I level data and Q level data sum to the same voltage level, such as the maximum voltage level). The voltage levels are expressed as 15-bit unsigned numbers, taking on values between 0 (low) and 32767 (high), such as 0 millivolts (mV) for voltage level 0 and 500 mV for voltage level 32767, with uniformly spaced voltages between 0 mV and 500 mV corresponding to the voltage levels between 0 and 32767. The voltage levels are being generated every 12.5 nanoseconds (ns) or 80 megahertz (MHz) over a sampling period of 300 ns. In addition to the magnitude being displayed as a value between 0 and 32767, the magnitude is also displayed as a percentage of the maximum value (32767).

The digital signal shape is that of a transition from the lowest voltage level value (0) to the highest voltage level value (32767) and includes three portions: (1) a curve in portion between 0 ns and 100 ns where the magnitudes are small (e.g., less than 10% of the highest magnitude) and the shape is (in this example) exponential (doubling every 12.5 ns), (2) a rising edge portion between 100 ns and 200 ns where the magnitudes are in the edge portion of a digital signal (e.g., between 10% and 90% of the highest magnitude) and the shape is linear (increasing 10% of the highest magnitude every 12.5 ns), and (3) a curve out portion between 200 ns and 300 ns where the magnitudes are large (e.g., greater than 90% of the highest magnitude) and the shape is (in this example) exponential decay (the increase halving every 12.5 ns).

The rising edge parameters (e.g., start and stop times, slope) are chosen so that the carrier signal modulation keeps the emitted modulated signal within the appropriate frequency bandwidth. It should be noted that the type of increase (e.g., exponential, exponential decay, to name a few) in the curve in portion can vary between embodiments, the start and end of the rising edge or linear portion can vary between embodiments, and the type of increase in the curve out portion can vary between embodiments (and be different from that of the curve in portion), and that those in FIGS. 4A and 4B are just examples.

In still other embodiments, other digital signal shape features are defined by I/Q signal magnitudes. For example, rise times can be defined by the start time (e.g., when the magnitude is 10% or similar low percentage of the maximum) and the end time (e.g., when the magnitude is 90% or similar high percentage of the maximum), with linear interpolations between the start time and the end time for corresponding percentages of the maximum between the low percentage and the high percentage. In addition, fall times can be defined similarly in reverse. Further, low times can be defined as some low value (such as 0 or a similar value or range of low values) over a period of time, while high times can be defined as some high value (such as the highest magnitude or a similar value or range of high values) over a period of time.

Moreover, pulses can include a low portion, a rising edge portion, a high portion, a falling edge portion, and another low portion, possibly with curve in portions between the low portion and the rising edge and between the high portion and the falling edge as well as curve out portions between the rising edge and the high portion and between the falling edge and the second low portion. In some embodiments, the high portion is used for I/Q modulated data (such as MSK data), such as when transmitting a burst (or pulse) of numerous bits of I/Q modulated data. Many digital signal shapes are possible by such techniques.

Methodology

FIG. 5 is a flow diagram of an example method 500 of digital signal shaping using an I/Q modulator, according to an embodiment of the present disclosure. More generally, the method 500 and other methods described herein may be implemented in hardware or combinations of hardware and software. For example, the method 500 may be implemented by the components or techniques of FIGS. 1-4B. In another embodiment, the method 500 may be implemented by a custom circuit such as an FPGA in combination with an I/Q modulator and other circuits such as a DAC and a clock circuit, all configured to carry out the method 500. In other embodiments, the method 500 may be performed in conjunction with a special purpose processor, such as a signal processor.

In some other embodiments, some or much of the method 500 may be implemented as a series of computer instructions, such as software, firmware, or a combination of the two, together with one or more computer processors (e.g., one or more microprocessors). The instructions, when executed on a given processor, cause portions of the method 500 to be performed. For example, in one or more embodiments, a computer program product is provided. The computer program product includes one or more non-transitory machine-readable mediums (such as a compact disc, a DVD, a solid-state drive, a hard drive, RAM, ROM, on-chip processor cache, or the like) encoded with instructions that when executed by one or more processors cause portions of the method 500 (or other method described herein) to be carried out for digital signal shaping with an I/Q modulator. In addition, while the methods described herein may appear to have a certain order to their operations, other embodiments may not be so limited. Accordingly, the order of the operations can be varied between embodiments, as would be apparent in light of this disclosure.

Referring to the method 500 of FIG. 5, processing begins with receiving 510, by a processing circuit (such as an FPGA or microprocessor 310), interrogating requests (such as interrogating requests 370) from an identification friend or foe (IFF) interrogator (such as IFF interrogator 110).

The method 500 further includes generating 520, by the processing circuit, digital I level data and Q level data (such as the sample I level data and Q level data illustrated in FIGS. 4A and 4B) as IFF responses in response to the interrogating requests. The generated I level data and the generated Q level data, when respectively converted to analog I baseband input and Q baseband input (such as analog voltage or current signals for driving an I/Q modulator, e.g., I/Q modulator 340), cause a carrier signal (such as carrier signal 390) modulated by the I baseband input and the Q baseband input to have a desired edge shape (such as the rising edge of FIGS. 4A-4B) in the time domain. The edge shape includes a low portion (such as the curve in portion of FIG. 4A), a high portion (such as the curve out portion of FIG. 4A), and edge portion (such as the rising edge portion of FIG. 4A) between the low portion and the high portion. The edge portion has a desired edge time (such as a desired rise time) compatible with the frequency of the carrier signal.

The method 500 further includes converting 530, by a DAC (such as DAC 320), the generated I level data to the I baseband input and the generated Q level data to the Q baseband input, and synchronizing 540, by a clock circuit (such as clock circuit 330), generating the I level data and the Q level data with converting the generated I level data to the I baseband input and the generated Q level data to the Q baseband input. The method 500 further includes performing 550, by the I/Q modulator, I/Q modulation of the carrier signal according to the I baseband input and the Q baseband input. Numerous other methods and techniques will be apparent in light of the present disclosure.

Further Example Embodiments

The following examples pertain to further embodiments, from which numerous permutations and configurations will be apparent.

Example 1 is a transmitter including: a processing circuit to generate I level data and Q level data that, when respectively converted to I baseband input and Q baseband input, cause a carrier signal modulated by the I baseband input and the Q baseband input to have a desired edge shape in the time domain, the edge shape including a low portion, a high portion, and an edge portion between the low portion and the high portion, the edge portion having a desired edge time compatible with the frequency of the carrier signal; a digital-to-analog converter (DAC) to convert the I level data to the I baseband input and the Q level data to the Q baseband input; and an in-phase and quadrature (I/Q) modulator to perform I/Q modulation of the carrier signal according to the I baseband input and the Q baseband input.

Example 2 includes the transmitter of Example 1, wherein the processing circuit is further to receive interrogating requests from an identification friend or foe (IFF) interrogator, and to generate the I level data and the Q level data as IFF responses in response to the interrogating requests.

Example 3 includes the transmitter of Example 1, wherein the processing circuit further generates the I level data and the Q level data so that the edge portion starts at a first time and ends at a second time, the difference between the first time and the second time being the desired edge time, the I level data corresponding to the first time is a first I level data value and the I level data corresponding to the second time is a second I level data value, the Q level data corresponding to the first time is a first Q level data value and the Q level data corresponding to the second time is a second Q level data value, the I level data corresponding to times between the first time and the second time are linear interpolations between the first I level data value and the second I level data value, and the Q level data corresponding to times between the first time and the second time are linear interpolations between the first Q level data value and the second Q level data value.

Example 4 includes the transmitter of Example 1, wherein the edge portion is a rising edge portion, the edge time is a desired rise time, and the processing circuit further generates the I level data and the Q level data so that the modulated carrier signal includes the low portion, the rising edge portion, the high portion, a falling edge portion, and another low portion in time order, the falling edge portion has a desired fall time, and the high portion has a desired high time.

Example 5 includes the transmitter of Example 1, further including a clock circuit to synchronize generating the I level data and the Q level data in the processing circuit with converting the I level data to the I baseband input and the Q level data to the Q baseband input in the DAC.

Example 6 includes the transmitter of Example 1, wherein the processing circuit includes a processor or logic circuitry configured to generate the I level data and the Q level data by: receiving interrogating requests from an identification friend or foe (IFF) interrogator; generating IFF responses in response to the interrogating requests by generating a first I level data value and a first Q level data value corresponding to a first time value at a start of the edge portion, generating a second I level data value and a second Q level data value corresponding to a second time value at an end of the edge portion, the difference between the first time value and the second time value being the desired edge time, and linearly interpolating a plurality of I level data values between the first I level data value and the second I level data value, a corresponding plurality of Q level data values between the first Q level data value and the second Q level data value, and a corresponding plurality of time values between the first time value and the second time value; and sending the generated I level data and the generated Q level data to the DAC.

Example 7 is an identification friend or foe (IFF) transponder including the transmitter of Example 1.

Example 8 is a method of digital signal shaping using an in-phase and quadrature (I/Q) modulator, the method including: generating, by a processing circuit, I level data and Q level data; converting, by a digital-to-analog converter (DAC), the generated I level data to I baseband input and the generated Q level data to Q baseband input; and performing, by the I/Q modulator, I/Q modulation of a carrier signal according to the I baseband input and the Q baseband input, wherein the generated I level data and the generated Q level data, when respectively converted to the I baseband input and the Q baseband input, cause the modulated carrier signal to have a desired edge shape in the time domain, the edge shape including a low portion, a high portion, and an edge portion between the low portion and the high portion, the edge portion having a desired edge time compatible with the frequency of the carrier signal.

Example 9 includes the method of Example 8, further including: receiving, by the processing circuit, interrogating requests from an identification friend or foe (IFF) interrogator; and generating, by the processing circuit, the I level data and the Q level data as IFF responses in response to the interrogating requests.

Example 10 includes the method of Example 8, wherein generating the I level data and the Q level data further includes generating the I level data and the Q level data so that the edge portion starts at a first time and ends at a second time, the difference between the first time and the second time being the desired edge time, the I level data corresponding to the first time is a first I level data value and the I level data corresponding to the second time is a second I level data value, the Q level data corresponding to the first time is a first Q level data value and the Q level data corresponding to the second time is a second Q level data value, the I level data corresponding to times between the first time and the second time are linear interpolations between the first I level data value and the second I level data value, and the Q level data corresponding to times between the first time and the second time are linear interpolations between the first Q level data value and the second Q level data value.

Example 11 includes the method of Example 8, wherein the edge portion is a rising edge portion, the edge time is a desired rise time, and the generating the I level data and the Q level data includes generating the I level data and the Q level data so that the modulated carrier signal includes the low portion, the rising edge portion, the high portion, a falling edge portion, and another low portion in time order, the falling edge portion has a desired fall time, and the high portion has a desired high time.

Example 12 includes the method of Example 8, further including synchronizing, by a clock circuit, generating the I level data and the Q level data with converting the generated I level data to the I baseband input and the generated Q level data to the Q baseband input.

Example 13 includes the method of Example 8, wherein generating the I level data and the Q level data includes: receiving interrogating requests from an identification friend or foe (IFF) interrogator; generating IFF responses in response to the interrogating requests by generating a first I level data value and a first Q level data value corresponding to a first time value at a start of the edge portion, generating a second I level data value and a second Q level data value corresponding to a second time value at an end of the edge portion, the difference between the first time value and the second time value being the desired edge time, and linearly interpolating a plurality of I level data values between the first I level data value and the second I level data value, a corresponding plurality of Q level data values between the first Q level data value and the second Q level data value, and a corresponding plurality of time values between the first time value and the second time value; and sending the generated I level data and the generated Q level data to the DAC.

Example 14 is a method of responding to an identification friend or foe (IFF) interrogator, the method including performing the digital signal shaping by the method of Example 8.

Example 15 is a computer program product including one or more non-transitory machine-readable storage mediums having instructions encoded thereon for performing the digital signal shaping by the method of Example 8 using the processing circuit in combination with the DAC and the I/Q modulator.

Example 16 is a system for digital signal shaping, the system including: the computer program product of Example 15; the processing circuit to execute the encoded instructions; the DAC; and the I/Q modulator.

Example 17 is a field-programmable gate array (FPGA) configured for digital signal shaping using an in-phase and quadrature (I/Q) modulator, the FPGA including: logic for receiving interrogating requests from an identification friend or foe (IFF) interrogator, logic for generating I level data and Q level data as IFF responses in response to the interrogating requests; and logic for sending the generated I level data and the generated Q level data to a digital-to-analog converter (DAC) to be respectively converted to I baseband input and Q baseband input, which when input to the I/Q modulator, cause the I/Q to perform I/Q modulation of a carrier signal according to the I baseband input and the Q baseband input, the modulated carrier signal having a desired edge shape in the time domain, the edge shape including a low portion, a high portion, and an edge portion between the low portion and the high portion, the edge portion having a desired edge time compatible with the frequency of the carrier signal.

Example 18 includes the FPGA of Example 17, wherein the logic for generating the I level data and the Q level data further includes logic for generating the I level data and the Q level data so that the edge portion starts at a first time and ends at a second time, the difference between the first time and the second time being the desired edge time, the I level data corresponding to the first time is a first I level data value and the I level data corresponding to the second time is a second I level data value, the Q level data corresponding to the first time is a first Q level data value and the Q level data corresponding to the second time is a second Q level data value, the I level data corresponding to times between the first time and the second time are linear interpolations between the first I level data value and the second I level data value, and the Q level data corresponding to times between the first time and the second time are linear interpolations between the first Q level data value and the second Q level data value.

Example 19 includes the FPGA of Example 17, wherein the edge portion is a rising edge portion, the edge time is a desired rise time, and the logic for generating the I level data and the Q level data includes logic for generating the I level data and the Q level data so that the modulated carrier signal includes the low portion, the rising edge portion, the high portion, a falling edge portion, and another low portion in time order, the falling edge portion has a desired fall time, and the high portion has a desired high time.

Example 20 includes the FPGA of Example 17, wherein the logic for generating the I level data and the Q level data includes logic for synchronizing, through a clock circuit, generating the I level data and the Q level data with converting the generated I level data to the I baseband input and the generated Q level data to the Q baseband input.

Example 21 includes the FPGA of Example 17, wherein the logic for generating the I level data and the Q level data includes: logic for generating a first I level data value and a first Q level data value corresponding to a first time value at a start of the edge portion; logic for generating a second I level data value and a second Q level data value corresponding to a second time value at an end of the edge portion, the difference between the first time value and the second time value being the desired edge time; and logic for linearly interpolating a plurality of I level data values between the first I level data value and the second I level data value, a corresponding plurality of Q level data values between the first Q level data value and the second Q level data value, and a corresponding plurality of time values between the first time value and the second time value.

Example 22 is an identification friend or foe (IFF) transponder including the FPGA of Example 17.

Example 23 is a system for digital signal shaping, the system including: the FPGA of Example 17; the DAC; and the I/Q modulator.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. In addition, various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications. It is intended that the scope of the present disclosure be limited not be this detailed description, but rather by the claims appended hereto. Future filed applications claiming priority to this application may claim the disclosed subject matter in a different manner and may generally include any set of one or more elements as variously disclosed or otherwise demonstrated herein.

What is claimed is:
1. A transmitter comprising:
a processing circuit comprising a processor logic circuitry configured to generate the I level data and the Q level data by:
receiving interrogating requests from an identification friend or foe (IFF) interrogator;
generating IFF responses in response to the interrogating requests by
generating a first I level data value and a first Q level data value corresponding to a first time value at a start of the edge portion, generating a second I level data value and a second Q level data value corresponding to a second time value at an end of the edge portion, the difference between the first time value and the second time value being the desired edge time, and linearly interpolating a plurality of I level data values between the first I level data value and the second I level data value, a corresponding plurality of Q level data values between the first Q level data value and the second Q level data value, and a corresponding plurality of time values between the first time value and the second time value, wherein the processing circuit generates I level data and Q level data that, when respectively converted to I baseband input and Q baseband input, cause a carrier signal modulated by the I baseband input and the Q baseband input to have a desired edge shape in the time domain, the edge shape including a low portion, a high portion, and an edge portion between the low portion and the high portion, the edge portion having a desired edge time compatible with the frequency of the carrier signal;

a digital-to-analog converter (DAC) to convert the I level data to the I baseband input and the Q level data to the Q baseband input, wherein the I level data and the Q level data generated by the processing circuit is sent to the DAC; and an in-phase and quadrature (I/Q) modulator to perform I/Q modulation of the carrier signal according to the I baseband input and the Q baseband input.

2. The transmitter of claim 1, wherein the edge portion is a rising edge portion, the edge time is a desired rise time, and the processing circuit further generates the I level data and the Q level data so that the modulated carrier signal includes the low portion, the rising edge portion, the high portion, a falling edge portion, and another low portion in time order, the falling edge portion has a desired fall time, and the high portion has a desired high time.

3. The transmitter of claim 1, further comprising a clock circuit to synchronize generating the I level data and the Q level data in the processing circuit with converting the I level data to the I baseband input and the Q level data to the Q baseband input in the DAC.

4. An identification friend or foe (IFF) transponder comprising the transmitter of claim 1.

5. A method of digital signal shaping using an in-phase and quadrature (I/Q) modulator, the method comprising:
generating, by a processing circuit, I level data and Q level data, wherein generating the I level data and the Q level data comprises
receiving interrogating requests from an identification friend or foe (IFF) interrogator;
generating IFF responses in response to the interrogating requests by generating a first I level data value and a first Q level data value corresponding to a first time value at a start of the edge portion,
generating a second I level data value and a second Q level data value corresponding to a second time value at an end of the edge portion, the difference between the first time value and the second time value being the desired edge time, and
linearly interpolating a plurality of I level data values between the first I level data value and the second I level data value, a corresponding plurality of Q level data values between the first Q level data value and the second Q level data value, and a corresponding plurality of time values between the first time value and the second time value; and
sending the generated I level data and the generated Q level data to the DAC;

converting, by a digital-to-analog converter (DAC), the generated I level data to I baseband input and the generated Q level data to Q baseband input; and performing, by the I/Q modulator, I/Q modulation of a carrier signal according to the I baseband input and the Q baseband input, wherein the generated I level data and the generated Q level data, when respectively converted to the I baseband input and the Q baseband input, cause the modulated carrier signal to have a desired edge shape in the time domain, the edge shape including a low portion, a high portion, and an edge portion between the low portion and the high portion, the edge portion having a desired edge time compatible with the frequency of the carrier signal.

6. The method of claim 5, wherein the edge portion is a rising edge portion, the edge time is a desired rise time, and the generating the I level data and the Q level data comprises generating the I level data and the Q level data so that the modulated carrier signal includes the low portion, the rising edge portion, the high portion, a falling edge portion, and another low portion in time order, the falling edge portion has a desired fall time, and the high portion has a desired high time.

7. The method of claim 5, further comprising synchronizing, by a clock circuit, generating the I level data and the Q level data with converting the generated I level data to the I baseband input and the generated Q level data to the Q baseband input.

8. A method of responding to an identification friend or foe (IFF) interrogator, the method comprising performing the digital signal shaping by the method of claim 5.

9. A computer program product including one or more non-transitory machine-readable storage mediums having instructions encoded thereon for performing the digital signal shaping by the method of claim 5 using the processing circuit in combination with the DAC and the I/Q modulator.

10. A system for digital signal shaping, the system comprising:
the computer program product of claim 9;
the processing circuit to execute the encoded instructions;
the DAC; and
the I/Q modulator.

11. A field-programmable gate array (FPGA) configured for digital signal shaping using an in-phase and quadrature (I/Q) modulator, the FPGA comprising:
logic for receiving interrogating requests from an identification friend or foe (IFF) interrogator,
logic for generating I level data and Q level data as IFF responses in response to the interrogating requests, wherein the logic for generating the I level data and the Q level data comprises
logic for generating a first I level data value and a first Q level data value corresponding to a first time value at a start of the edge portion;
logic for generating a second I level data value and a second Q level data value corresponding to a second time value at an end of the edge portion, the difference between the first time value and the second time value being the desired edge time; and
logic for linearly interpolating a plurality of I level data values between the first I level data value and the second I level data value, a corresponding plurality of Q level data values between the first Q level data value and the second Q level data value, and a corresponding plurality of time values between the first time value and the second time value; and logic for sending the generated I level data and the generated Q level data to a digital-to-analog converter (DAC) to be respectively converted to I baseband input and Q baseband input, which when input to the I/Q modulator, cause the I/Q to perform I/Q modulation of a carrier signal according to the I baseband input and the Q baseband input, the modulated carrier signal having a desired edge shape in the time domain, the edge shape including a low portion, a high portion, and an edge portion between the low portion and the high portion, the edge portion having a desired edge time compatible with the frequency of the carrier signal.

12. The FPGA of claim 11, wherein the edge portion is a rising edge portion, the edge time is a desired rise time, and the logic for generating the I level data and the Q level data comprises logic for generating the I level data and the Q level data so that the modulated carrier signal includes the low portion, the rising edge portion, the high portion, a falling edge portion, and another low portion in time order, the falling edge portion has a desired fall time, and the high portion has a desired high time.

13. The FPGA of claim 11, wherein the logic for generating the I level data and the Q level data comprises logic for synchronizing, through a clock circuit, generating the I level data and the Q level data with converting the generated I level data to the I baseband input and the generated Q level data to the Q baseband input.

14. An identification friend or foe (IFF) transponder comprising the FPGA of claim 11.

15. A system for digital signal shaping, the system comprising:
the FPGA of claim 11;
the DAC; and
the I/Q modulator.

* * * * *